US008203192B2

(12) United States Patent
Gao et al.

(10) Patent No.: US 8,203,192 B2
(45) Date of Patent: Jun. 19, 2012

(54) STRAM WITH COMPENSATION ELEMENT AND METHOD OF MAKING THE SAME

(75) Inventors: Kaizhong Gao, Eden Prairie, MN (US); Haiwen Xi, Prior Lake, MN (US); Wenzhong Zhu, Apple Valley, MN (US); Olle Heinonen, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/086,613

(22) Filed: Apr. 14, 2011

(65) Prior Publication Data
US 2011/0194343 A1    Aug. 11, 2011

Related U.S. Application Data

(62) Division of application No. 12/396,905, filed on Mar. 3, 2009, now Pat. No. 8,053,255.

(51) Int. Cl.
*H01L 21/66* (2006.01)
*G01R 33/02* (2006.01)
*G11C 11/14* (2006.01)

(52) U.S. Cl. .............. 257/421; 257/E21.521; 365/171; 324/244

(58) Field of Classification Search .............. 257/421, 257/E21.521; 365/171; 324/244
See application file for complete search history.

(56) References Cited

U.S. PATENT DOCUMENTS

| | | | |
|---|---|---|---|
| 5,461,526 A | 10/1995 | Hamakawa | |
| 5,841,692 A | 11/1998 | Gallagher | |
| 5,963,472 A | 10/1999 | Inada | |
| 6,166,948 A | 12/2000 | Parkin | |
| 6,183,859 B1 | 2/2001 | Chen | |
| 6,522,573 B2 | 2/2003 | Saito | |
| 6,597,618 B2 | 7/2003 | Zheng | |
| 6,605,772 B2 | 8/2003 | Harman | |
| 6,633,498 B1 | 10/2003 | Engel | |
| 6,714,444 B2 | 3/2004 | Huai | |
| 6,771,534 B2 | 8/2004 | Stipe | |

(Continued)

FOREIGN PATENT DOCUMENTS
WO    WO 2008/154519    12/2008

OTHER PUBLICATIONS

U.S. Appl. No. 12/396,868, filed Mar. 3, 2009, Zheng.

(Continued)

*Primary Examiner* — David S Blum
(74) *Attorney, Agent, or Firm* — Mueting Raasch & Gebhardt

(57) ABSTRACT

Spin-transfer torque memory having a compensation element is disclosed. A spin-transfer torque memory unit includes a free magnetic layer having a magnetic easy axis and a magnetization orientation that can change direction due to spin-torque transfer when a write current passes through the spin-transfer torque memory unit; a reference magnetic element having a magnetization orientation that is pinned in a reference direction; an electrically insulating and non-magnetic tunneling barrier layer separating the free magnetic layer from the magnetic reference element; and a compensation element adjacent to the free magnetic layer. The compensation element applies a bias field on the magnetization orientation of the free magnetic layer. The bias field is formed of a first vector component parallel to the easy axis of the free magnetic layer and a second vector component orthogonal to the easy axis of the free magnetic layer. The bias field reduces a write current magnitude required to switch the direction of the magnetization orientation of the free magnetic layer.

20 Claims, 5 Drawing Sheets

U.S. PATENT DOCUMENTS

| | | | |
|---|---|---|---|
| 6,781,874 B2 | 8/2004 | Hidaka |
| 6,791,865 B2 | 9/2004 | Tran |
| 6,819,586 B1 | 11/2004 | Anthony |
| 6,829,161 B2 | 12/2004 | Huai |
| 6,838,740 B2 | 1/2005 | Huai |
| 6,845,038 B1 | 1/2005 | Shukh |
| 6,847,547 B2 | 1/2005 | Albert |
| 6,888,742 B1 | 5/2005 | Nguyen |
| 6,903,400 B2 | 6/2005 | Kikuchi |
| 6,933,155 B2 | 8/2005 | Albert |
| 6,950,335 B2 | 9/2005 | Dieny |
| 6,958,927 B1 | 10/2005 | Nguyen |
| 6,963,098 B2 | 11/2005 | Daughton |
| 6,967,863 B2 | 11/2005 | Huai |
| 6,980,464 B2 | 12/2005 | Fukuzumi |
| 6,980,469 B2 | 12/2005 | Kent |
| 6,985,385 B2 | 1/2006 | Nguyen |
| 6,992,359 B2 | 1/2006 | Nguyen |
| 7,006,336 B2 | 2/2006 | Coffey |
| 7,020,009 B2 | 3/2006 | Ho |
| 7,031,178 B2 | 4/2006 | Parkin |
| 7,057,921 B2 | 6/2006 | Valet |
| 7,088,609 B2 | 8/2006 | Valet |
| 7,098,494 B2 | 8/2006 | Pakala |
| 7,110,287 B2 | 9/2006 | Huai |
| 7,126,202 B2 | 10/2006 | Huai |
| 7,160,770 B2 | 1/2007 | Sasaki |
| 7,161,829 B2 | 1/2007 | Huai |
| 7,170,778 B2 | 1/2007 | Kent |
| 7,180,113 B2 | 2/2007 | Braun |
| 7,180,770 B2 | 2/2007 | Perner |
| 7,187,577 B1 | 3/2007 | Wang |
| 7,190,611 B2 | 3/2007 | Nguyen |
| 7,205,564 B2 | 4/2007 | Kajiyama |
| 7,224,601 B2 | 5/2007 | Panchula |
| 7,227,773 B1 | 6/2007 | Nguyen |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen et al. |
| 7,242,048 B2 | 7/2007 | Huai |
| 7,245,462 B2 | 7/2007 | Huai |
| 7,252,852 B1 | 8/2007 | Parkin |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,286,395 B2 | 10/2007 | Chen |
| 7,289,356 B2 | 10/2007 | Diao |
| 7,307,876 B2 | 12/2007 | Kent |
| 7,310,265 B2 | 12/2007 | Zheng |
| 7,339,817 B2 | 3/2008 | Nickel |
| 7,342,169 B2 | 3/2008 | Venkatasubramanian |
| 7,345,911 B2 | 3/2008 | Min |
| 7,345,912 B2 | 3/2008 | Luo |
| 7,349,243 B2 | 3/2008 | Lin |
| 7,369,427 B2 | 5/2008 | Diao |
| 7,372,116 B2 | 5/2008 | Fullerton |
| 7,379,327 B2 | 5/2008 | Chen |
| 7,411,817 B2 | 8/2008 | Nozieres |
| 7,430,135 B2 | 9/2008 | Huai |
| 7,453,720 B2 | 11/2008 | Ju |
| 7,479,193 B1 | 1/2009 | Clark |
| 7,486,545 B2 | 2/2009 | Min |
| 7,486,551 B1 | 2/2009 | Li |
| 7,486,552 B2 | 2/2009 | Apalkov |
| 7,489,541 B2 | 2/2009 | Pakala |
| 7,502,249 B1 | 3/2009 | Ding |
| 7,508,702 B2 | 3/2009 | Ho |
| 7,515,457 B2 | 4/2009 | Chen |
| 7,518,835 B2 | 4/2009 | Huai |
| 7,525,862 B1 | 4/2009 | Sun |
| 7,576,956 B2 | 8/2009 | Huai |
| 7,660,151 B2 | 2/2010 | Leuschner |
| 7,804,709 B2 | 9/2010 | Wang |
| 2002/0181169 A1 | 12/2002 | Pinarbasi |
| 2002/0186582 A1 | 12/2002 | Sharma |
| 2004/0084702 A1 | 5/2004 | Jeong |
| 2004/0105326 A1 | 6/2004 | Matsuoka |
| 2004/0188733 A1 | 9/2004 | Asao |
| 2004/0233760 A1 | 11/2004 | Guo |
| 2005/0018475 A1 | 1/2005 | Tran |
| 2005/0104146 A1 | 5/2005 | Nickel |
| 2005/0150535 A1 | 7/2005 | Samavedam |
| 2005/0150537 A1 | 7/2005 | Ghoshal |
| 2005/0157544 A1 | 7/2005 | Min |
| 2006/0215444 A1 | 9/2006 | Perner |
| 2007/0034919 A1 | 2/2007 | Wang |
| 2007/0085068 A1 | 4/2007 | Apalkov |
| 2007/0165449 A1 | 7/2007 | Zheng |
| 2007/0176251 A1 | 8/2007 | Oh |
| 2007/0258281 A1 | 11/2007 | Ifo |
| 2008/0019040 A1 | 1/2008 | Zhu |
| 2008/0037179 A1 | 2/2008 | Ito et al. |
| 2008/0055792 A1 | 3/2008 | Zheng |
| 2008/0112094 A1 | 5/2008 | Kent |
| 2008/0137224 A1 | 6/2008 | Gao |
| 2008/0154519 A1 | 6/2008 | Zhou |
| 2008/0180827 A1 | 7/2008 | Zhu |
| 2008/0186758 A1 | 8/2008 | Shen |
| 2008/0225584 A1 | 9/2008 | Gao |
| 2008/0273380 A1 | 11/2008 | Diao |
| 2008/0291720 A1 | 11/2008 | Wang |
| 2008/0291721 A1 | 11/2008 | Apalkov |
| 2008/0310213 A1 | 12/2008 | Chen |
| 2008/0310219 A1 | 12/2008 | Chen |
| 2009/0010040 A1 | 1/2009 | Takase |
| 2009/0040855 A1 | 2/2009 | Luo |
| 2009/0050991 A1 | 2/2009 | Nagai |
| 2009/0073750 A1 | 3/2009 | Leuschner |
| 2009/0185410 A1 | 7/2009 | Huai |
| 2009/0302403 A1 | 12/2009 | Nguyen |
| 2010/0032738 A1 | 2/2010 | Zhu |
| 2010/0034008 A1 | 2/2010 | Wang |
| 2010/0084725 A1 | 4/2010 | Zhu |
| 2010/0109108 A1 | 5/2010 | Zheng |

OTHER PUBLICATIONS

Berger, L., Emission of Spin waves by a magnetic multilayer traversed by a current, Physical Review B, 1, Oct. 1996, pp. 9353-9358, vol. 54, No. 13, The American Physical Society, USA.

Florez, S.H. et al., Modification of Critical Spin Torque Current Induced by rf Excitation, Journal of Applied Physics, 103, 07a708 (2008).

Han et al., Current-Induced Butterfly Shaped Domains and Magnetization Switching in Magnetic Tunnel Junctions, Science and Technology of Advanced Materials 6 (2005) 784-788.

Hosomi et al., A Novel Nonvolatile Memory with Spin Torque Transfer Magnetization Switching: Spin-RAM, 2005 IEEE.

Johnson, M.T., et al., Magnetic anisotropy in metallic multilayers, Rep. Prog. Phys., 1996, pp. 1409-1458, vol. 59, IOP Publishing Ltd., UK.

Kawahara et al., 2Mb Spin-Transfer Torque RAM (SPRAM) with Bit-by-bit Bidirectional Current Write and Parallelizing Direction Current Read, ISSC 2007/Session 26/Non-Volatile Memories/26.5.

Kim, Chris H., et al. Dynamic Vt SRAM: A Leakage Tolerant Cache Memory for Low Voltage Microprocessors, ISLPED '02, Aug. 2002, pp. 251-254, US.

Ozatay et al., "Sidewall oxide effects on spin-torque- and magnetic-field-induced reversal characteristics of thin-film nanomagnets", Nature Materials, vol. 7, pp. 567-573 (Jul. 2008).

Rivkin, K. et al., Magnetization Reversal in the Anisotropy-Dominated Regine Using Time-Dependent Magnetic Fileds, Applied Physics Letters 89, 252507 (2006).

Slonczewski et al., Conductance and Exchange Coupling of Two Ferromagnets Separated by a Tunneling Barrier, 1989 the American Physical Society, Physical Review B, vol. 39, No. 10, Apr. 1, 1989.

Thiele et al., "FeRh//FePt Exchange Spring Films for Thermally Assisted Magnetic Recording Media", Applied Physics Letters, vol. 82, No. 17, Apr. 2003, p. 2859-2861.

Thiele et al., "Magnetic and Structural Properties of FePt-FeRh Exchange Spring Films for Thermally Assisted Magnetic Recording Media", IEEE Trans. Magnetics, vol. 40, Jul. 2004, p. 2537-2542.

Thiele et al., Spin Dynamics of the Anitferromagnetic-to-Ferromagnetic Phase Transition in FeRh on a Sub-Picosecind Time Scale, Applied Physics Letters, vol. 85, No. 14, Oct. 2004, p. 2857-2859.

Yagami, Kojiro, et al., Inspection of Intrinsic Critical Currents for Spin-Transfer Magnetization Switching, IEEE Transactions on Magnetics, Oct. 2005, pp. 2615-2617, vol. 41, No. 10.

Zhang, L., et al., Heat-assisted magnetic probe recording on a granular CoNi/Pt multilayered film, Journal of Physics D: Applied Physics, 2006, pp. 2485-2487, vol. 39, IOP Publishing Ltd., UK.

U.S. Appl. No. 12/106,363, filed Apr. 21, 2008, Inventors: Xi et al.
U.S. Appl. No. 12/125,975, filed May 23, 2008, Inventors: Xi et al.
U.S. Appl. No. 12/239,887, filed Sep. 29, 2008, Inventors: Zheng et al.
U.S. Appl. No. 12/242,254, filed Sep. 30, 2008, Inventors: Zheng et al.
U.S. Appl. No. 12/248,237, filed Oct. 9, 2008, Inventor: Zhu.
U.S. Appl. No. 12/389,422, filed Feb. 20, 2009, Inventors: Ahn et al.
U.S. Appl. No. 12/425,457, filed Apr. 17, 2009, Inventors: Gao et al.
U.S. Appl. No. 12/425,466, filed Apr. 17, 2009, Inventors: Lou et al.

Zheng, et al., Multilevel Magnetic Resistive Random Access Memory Written at Curie Point, Intermag Europe 2002, BB-02.

Meng et al., Spin Transfer in Nanomagnetic Devices with Perpendicular Anistropy, Applied Physics Letters 88, 172506 (2006).

Sek et al., Spin-Polarized Current-Induced Magnetization Reversal in Perpendicularly Magnetized L1o-FePt Layers, Applied Physics Letters 88, 172504 (2006).

Zheng et al., Magnetic Random Access Memory (MRAM), Journal of Nanoscience and Nanotechnology, vol. 7, 117-137 (2007).

I L. Prejbeanu et al., Thermally Assisted MRAM, Journal of Physics Condensed Matter 19 (2007) 165218 (23 pp).

Slonczewski et al., Current-Driven Excitation of Magnetic Multilayers, Journal of Magnetism and Magnetic Materials 159 (1996) L1-L7.

Sun, Spin-Current Interaction with Monodomain Magnetic Body: A Model Study, Physical Review B, vol. 62, No. 1, Jul. 2000.

Zheng et al., Multistate Per-Cell Magnetoresistive Random-Access Memory Written at Curie Point, IEEE Transactions on Magnetics, vol. 38, No. 5, Sep. 2002.

Zhang et al., Heat-Assisted Magnetic Probe Recording on a Granular CoNi/Pt Multilayered Film, Journal of Physics D: Applied Physics, 39, (2006) 2485-2487.

STRAM WITH COMPENSATION ELEMENT AND METHOD OF MAKING THE SAME

CROSS-REFERENCE TO RELATED APPLICATIONS

This application is a divisional application of U.S. application Ser. No. 12/396,905<now U.S. Pat. No. 8,053,255, filed on Mar. 3, 2009, the contents of which are hereby incorporated by reference in its entirety.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe.

An MRAM write mechanism called Spin-Transfer Torque RAM (STRAM) uses a (bidirectional) current through the MTJ to realize the resistance switching. The switching mechanism of STRAM is constrained locally and STRAM is believed to have a better scaling property than the conventional MRAM.

However, a number of yield-limiting factors should be overcome before STRAM enters the production stage. One concern in traditional STRAM design is the large switching field distribution and magnetic field offset creating an asymmetric switching field. Thus, there is a need to improve the switching field symmetry and magnetic field offset.

BRIEF SUMMARY

The present disclosure relates to a spin-transfer torque memory unit that includes a compensation element. In particular, the present disclosure relates to a spin-transfer torque memory unit that includes a compensation element that has its magnetization orientation set after it is deposited and a magnetic property of the spin-transfer torque memory unit has been measured.

In one particular embodiment, a spin-transfer torque memory having a compensation element is disclosed. A spin-transfer torque memory unit includes a free magnetic layer having a magnetic easy axis and a magnetization orientation that can change direction due to spin-torque transfer when a write current passes through the spin-transfer torque memory unit; a reference magnetic element has a magnetization orientation that is pinned in a reference direction; an electrically insulating and non-magnetic tunneling barrier layer separates the free magnetic layer from the magnetic reference element; and a compensation element is adjacent to the free magnetic layer. The compensation element applies a bias field on the magnetization orientation of the free magnetic layer. The bias field is formed of a first vector component parallel to the easy axis of the free magnetic layer and a second vector component orthogonal to the easy axis of the free magnetic layer. The bias field reduces a write current magnitude required to switch the direction of the magnetization orientation of the free magnetic layer, improves the write current symmetry, and/or reduces the switching current distribution for a population of spin-transfer torque memory cells.

An illustrative embodiment of a method includes measuring a magnetic property of a spin-torque transfer memory unit and applying a magnetic field to the magnetic compensation element to set a magnetization orientation of the magnetic compensation element. The magnetic field is selected based on the measured magnetic property of the spin-torque transfer memory unit.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
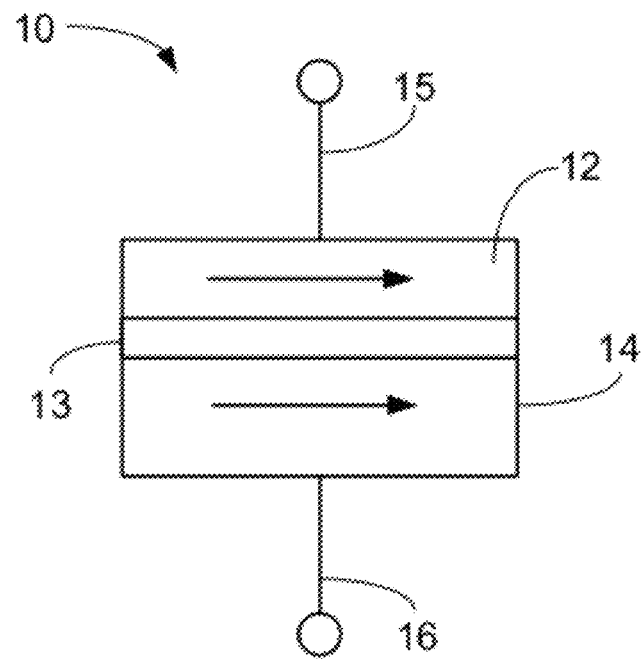
FIG. 1 is a cross-sectional schematic diagram of an illustrative magnetic tunneling junction (MTJ) in the low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a spin-transfer torque memory (STRAM) that includes a compensation element. In particular, the present disclosure relates to a spin-transfer torque memory unit that includes a compensation element that has its magnetization orientation set after it is deposited adjacent to the spin-transfer torque memory and a magnetic property of the spin-transfer torque memory unit has been measured. The magnetization orientation of the compensation layer is set to improve the measured property of the spin-transfer torque memory unit. For example, the magnetization orientation of the compensation element can be set so that the magnetization orientation of the compensation element applies a bias field on the magnetization orientation of the free magnetic layer, where the bias field shifts a resistance-current hysteresis loop magnetic property of the spin-torque transfer memory unit, reduces a write current magnitude required to switch the direction of the magnetization orientation of the free magnetic layer, and/or reduces the switching current distribution for a population of spin-transfer torque memory cells. The bias field can include a first vector component parallel to the easy axis of the free magnetic layer and a second vector component orthogonal to the easy axis of the free magnetic layer. While the present disclosure is not so limited, an appreciation of various aspects of the disclosure will be gained through a discussion of the examples provided below.

Figure 2:
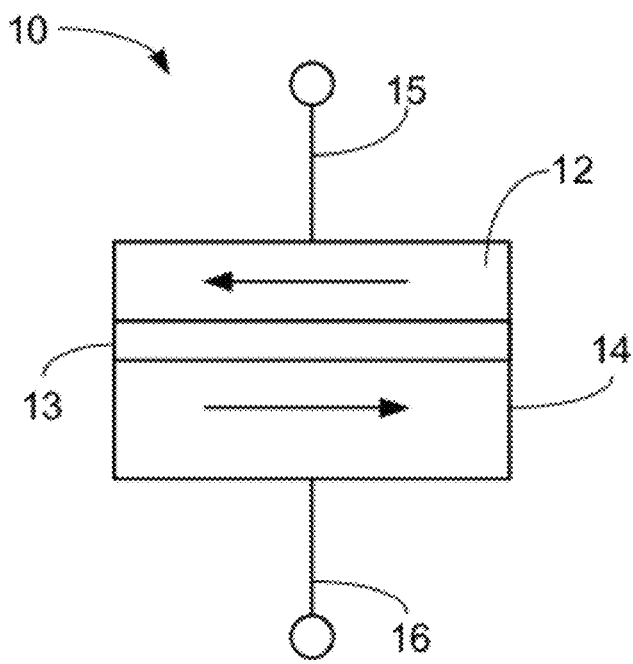
FIG. 2 is a cross-sectional schematic diagram of the illustrative MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any memory cell that can switch between a high resistance state and a low resistance state. In many embodiments, the variable resistive memory cell described herein is a spin-transfer torque memory cell.

The MTJ cell 10 includes a ferromagnetic free layer 12 (i.e., free magnetic layer) and a ferromagnetic reference (e.g., pinned) 14 (i.e., reference or pinned magnetic layer). The ferromagnetic free layer 12 and a ferromagnetic reference layer 14 are separated by an oxide barrier layer 13 or tunneling barrier layer. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating tunneling barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free magnetic layer 12, the magnetization orientation of the free magnetic layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 may be used to construct a memory device that includes multiple variable resistive memory cells where a data bit is stored in magnetic tunnel junction cell by changing the relative magnetization state of the free magnetic layer 12 with respect to the pinned or reference magnetic layer 14. The stored data bit can be read out by measuring the resistance of the cell which changes with the magnetization direction of the free magnetic layer relative to the pinned magnetic layer. In order for the spin-transfer torque MTJ cell 10 to have the characteristics of a non-volatile random access memory, the free magnetic layer exhibits thermal stability against random fluctuations so that the orientation of the free magnetic layer is changed only when it is controlled to make such a change. Generally, anisotropy causes a soft and hard axis to form in thin magnetic layers. The hard and soft axes are defined by the magnitude of the energy, usually in the form of a magnetic field, needed to fully rotate (saturate) the direction of the magnetization in that direction, with the hard axis requiring a higher saturation magnetic field.

Figure 3:
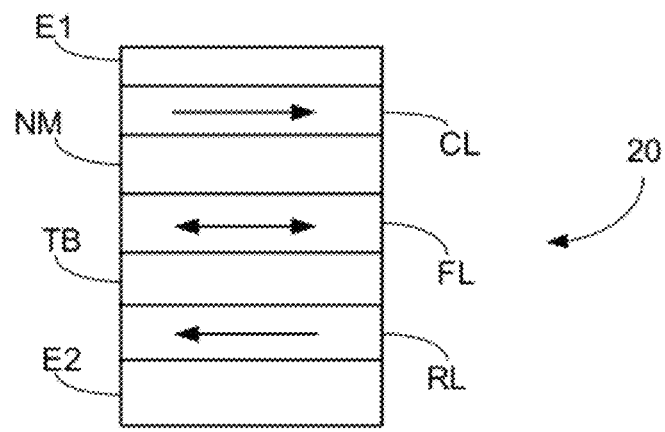
FIG. 3 is a side view schematic diagram of an illustrative spin-transfer torque memory unit.

FIG. 3 is a side view schematic diagram of an illustrative spin-transfer torque memory unit 20. The spin-transfer torque memory unit 20 includes a free magnetic element or layer FL, a reference magnetic element or layer RL, and an electrically insulating and non-magnetic tunneling barrier layer TB separating the free magnetic layer FL from the reference magnetic layer RL. The spin-transfer torque memory unit 20 further includes a compensation layer CL and a non-magnetic layer IL separating the compensation layer CL from the free magnetic layer FL. The compensation layer CL is a ferromagnetic material that can have a hard magnetic property that can be set following deposition of the magnetic compensation layer CL. The reference magnetic layer RL can be a single ferromagnetic layer, or may include multiple layers, for example, a pair of ferromagnetically coupled ferromagnetic layers, an antiferromagnetic pinning layer and a ferromagnetic pinned layer, a synthetic antiferromagnetic, or a synthetic antiferromagnetic with an antiferromagnetic layer.

The non-magnetic layer NM can be electrically conductive or electrically insulating. An electrically insulating and non-magnetic layer NM can be formed of any useful electrically insulating non-magnetic material such as $Al_2O_3$ or MgO. An electrically conducting and non-magnetic layer NM can be formed of any useful electrically conducting non-magnetic material such as Ru, Os, Ti, Cr, Rh, Cu, Pd, or sombinations thereof. This non-magnetic layer NM can have a thickness in a range from 1 to 10 nanometers or from 3 to 7 nanometers.

Figure 4:
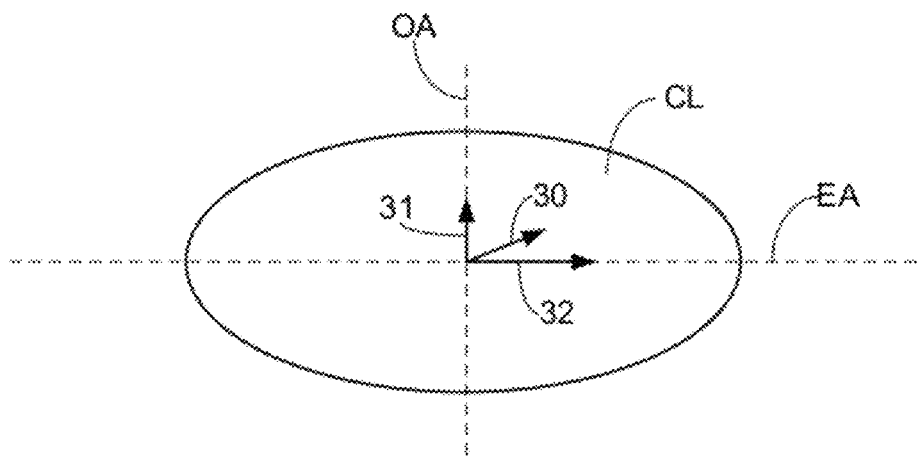
FIG. 4 is a top view schematic diagram of an illustrative compensation element.

The compensation element CL applies a bias field on the magnetization orientation of the free magnetic layer FL. FIG. 4 is a top view schematic diagram of an illustrative magnetic compensation element CL. The compensation element CL is illustrated having an elliptical shape, however the compensation element CL can have any useful shape such as, a rectangle, circle, ellipse, or any polygonal shape. The free magnetic layer is disposed beneath the compensation element CL, however the easy axis EA and a perpendicular or orthogonal axis OA (i.e., hard axis) of the free magnetic layer as illustrated as dashed lines superimposed on the compensation element CL. In many embodiments the compensation element CL is patterned onto the spin-torque transfer cell and has a substantially similar shape and size as the spin-torque transfer cell. Deposition of the compensation element CL does not set the magnetization orientation of the compensation element CL in any particular direction. Setting the magnetization orientation of the compensation element CL is accomplished after deposition of the compensation element CL. Thus, the magnetization orientation of the compensation element CL can be custom set depending on the desired magnetic effect.

The bias field generated by the compensation element CL is a result of a magnetic moment vector 30 or magnetization orientation 30 (that is set by an external magnetic field for example, following deposition of the compensation element CL) of the compensation element CL. The magnetic moment vector 30 is the vector sum of a first vector component 32 that is parallel to the free magnetic layer easy axis EA and a second vector component 31 that is orthogonal to the free magnetic layer easy axis (thus parallel to the free magnetic layer orthogonal axis OA).

Figure 5:
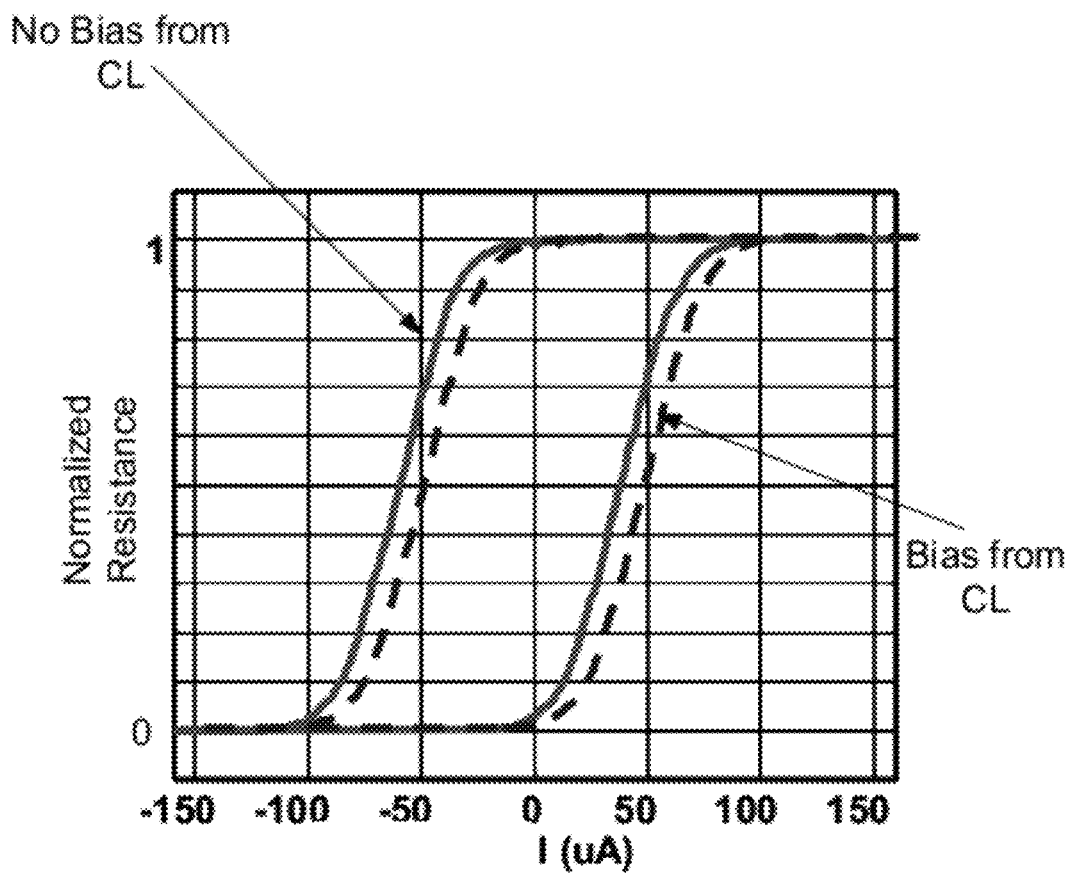
FIG. 5 is a resistance-current hysteresis loop magnetic property graph illustrating the shift of this curve upon application of the bias field from the built in compensation layer.

The first vector component 32 that is parallel to the free magnetic layer easy axis EA can shift a resistance-current hysteresis loop magnetic property of the spin-torque transfer memory unit or a resistance-voltage hysteresis loop magnetic property of the spin-torque transfer memory unit, and the like. A direction of the first vector component 32 determines the direction of the resistance-current hysteresis loop magnetic property shift. The magnitude of the shift can be altered by increasing or decreasing a thickness of the compensation element CL. The resistance-current hysteresis loop magnetic property of the spin-transfer torque memory unit can be measured and then the direction and amount of first vector component 32 can be set as desired. In many embodiments, the first vector component 32 is set to shift the resistance-current hysteresis loop magnetic property to that the switching current is more symmetric than what was measured. FIG. 5 is a resistance-current hysteresis loop magnetic property graph illustrating the shift of this curve upon application of the bias field (including the first vector component 32) from the built in compensation layer CL. Here the resistance-current hysteresis loop shifts to the right (dashed line) upon application of the bias field (first vector component) from the compensation layer CL causing the resistance-current hysteresis loop to be more symmetric about the 0 axis of the I (current) axis or x-axis.

Figure 6:
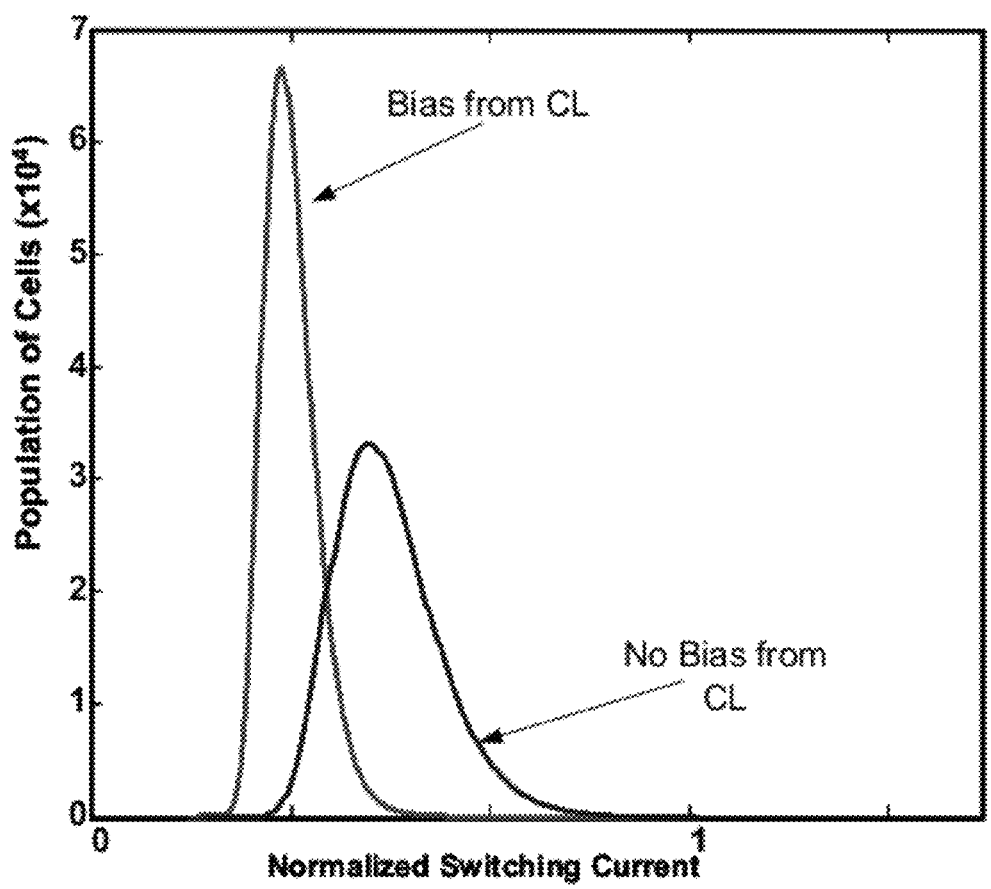
FIG. 6 is a switching current magnetic property graph for a spin-torque transfer memory unit illustrating the reduction of the switching current and reduction in the switching current distribution for a population of spin-transfer torque memory unit upon application of the bias field (including the second vector component) from the built in compensation layer.

The second vector component 31 that is perpendicular to the free magnetic layer easy axis EA can reduce a write current magnitude required to switch the direction of the magnetization orientation of the free magnetic layer. The write current magnitude required to switch the direction of the magnetization orientation of the free magnetic layer can be measured and then the direction and amount of second vector component 31 can be set as desired. In many embodiments, the second vector component 31 is set to reduce the write current magnitude required to switch the direction of the magnetization orientation of the free magnetic layer. from what was measured. FIG. 6 is a switching current magnetic property graph for a spin-torque transfer memory unit illustrating the reduction of the switching current and reduction in the switching current distribution for a population of spin-torque transfer memory unit upon application of the bias field (including the second vector component 31) from the built in compensation layer CL. As, illustrated, the bias field (having a second vector component 31) reduces a write current magnitude required to switch the direction of the magnetization orientation of the free magnetic layer.

Figure 7:
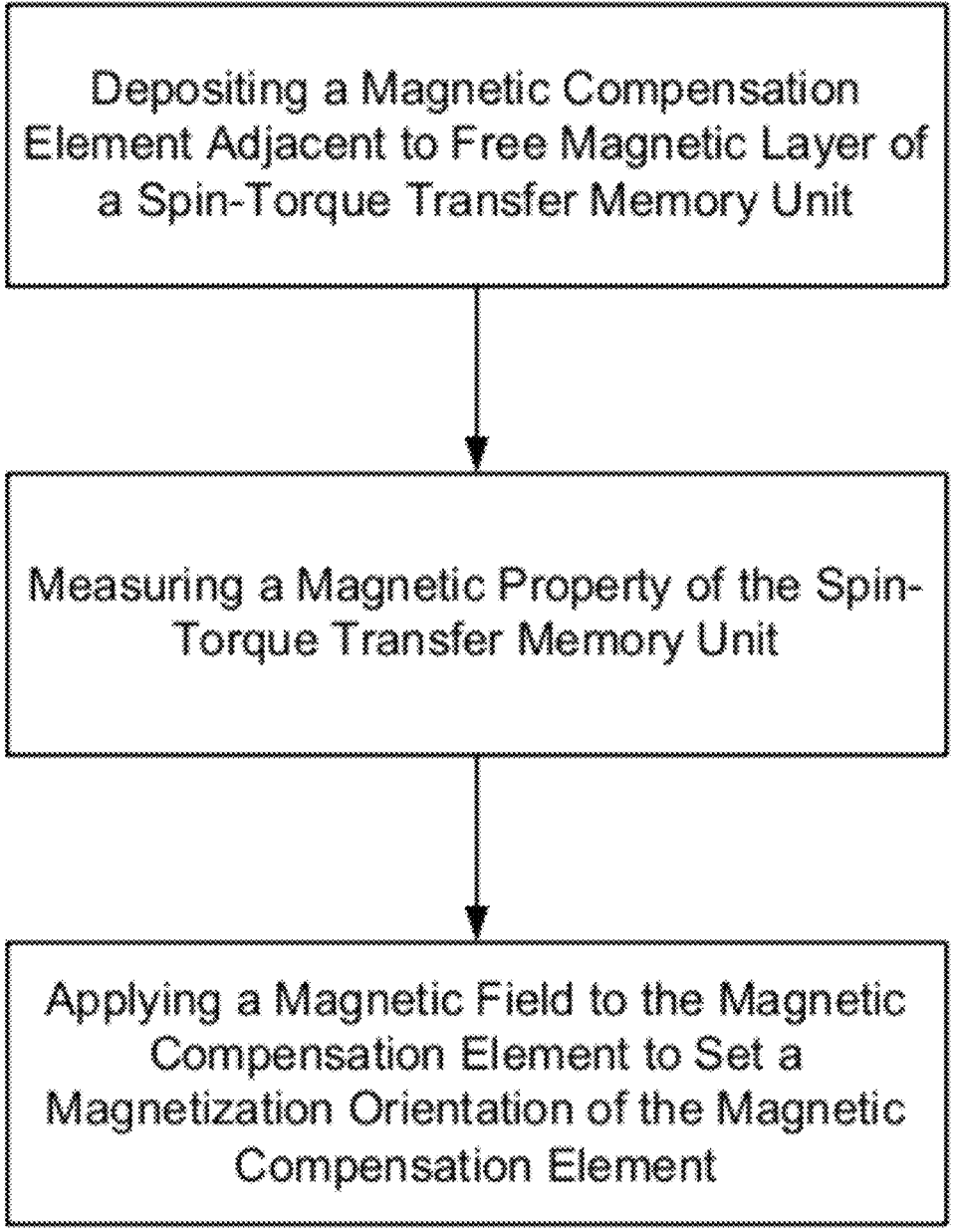
FIG. 7 is a flow diagram of a method of compensating a spin-transfer torque memory unit.

FIG. 7 is a flow diagram of a method of compensating a spin-transfer torque memory unit. The method includes depositing a magnetic compensation element adjacent to a free magnetic layer of a spin-torque transfer memory unit and then measuring a magnetic property of a spin-torque transfer memory unit. Then the method includes applying a magnetic field to the magnetic compensation element to set a magnetization orientation of the magnetic compensation element. The magnetic field (composed of the first vector component and second vector component) is selected based on the measured magnetic property of the spin-torque transfer memory unit, as described above. The spin-transfer torque memory units described herein can be fabricated utilizing conventional semiconductor fabrication techniques.

Thus, embodiments of the STRAM WITH COMPENSATION ELEMENT AND METHOD OF MAKING THE SAME are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A spin-transfer torque memory unit, comprising:
 a free magnetic layer having a magnetic easy axis and a magnetization orientation that can change direction due to spin-torque transfer when a write current passes through the spin-transfer torque memory unit;
 a reference magnetic element having a magnetization orientation that is pinned in a reference direction;
 an electrically insulating and non-magnetic tunneling barrier layer separating the free magnetic layer from the magnetic reference element; and
 a compensation element adjacent to the free magnetic layer, the compensation element applying a bias field on the magnetization orientation of the free magnetic layer, the bias field comprising a first vector component parallel to the easy axis of the free magnetic layer and a second vector component orthogonal to the easy axis of the free magnetic layer, wherein the bias field reduces a write current magnitude required to switch the direction of the magnetization orientation of the free magnetic layer.

2. A spin-transfer torque memory unit according to claim 1, further comprising an electrically conductive and non-magnetic spacer layer separating the compensation element from the free magnetic layer.

3. A spin-transfer torque memory unit according to claim 1, further comprising a second electrically insulating and non-magnetic spacer layer separating the compensation element from the free magnetic layer.

4. A spin-transfer torque memory unit according to claim 1, wherein the reference magnetic element comprises a synthetic antiferromagnetic reference element.

5. A spin-transfer torque memory unit according to claim 1, wherein the compensation element comprises a ferromagnetic material having a hard magnetic property.

6. A spin-transfer torque memory unit according to claim 2, wherein the electrically conductive and non-magnetic spacer layer has a thickness in a range from 1 to 10 nanometers.

7. A spin-transfer torque memory unit according to claim 1, wherein the compensation element and the free magnetic layer have a similar shape.

8. A spin-transfer torque memory unit according to claim 1, wherein the compensation element applies a bias field on the magnetization orientation of the free magnetic layer and the bias field is configured to be set after a magnetic property of the spin-transfer torque memory unit is measured.

9. A spin-transfer torque memory apparatus, comprising:
a spin-transfer torque memory unit comprising:
a free magnetic layer having a magnetic easy axis and a magnetization orientation that can change direction due to spin-torque transfer when a write current passes through the spin-transfer torque memory unit;
a reference magnetic element having a magnetization orientation that is pinned in a reference direction; and
an electrically insulating and non-magnetic tunneling barrier layer separating the free magnetic layer from the magnetic reference element; and
a compensation element adjacent to the spin-transfer torque memory unit, the compensation element applying a bias field on the magnetization orientation of the free magnetic layer, wherein the bias field is configured to be set after a magnetic property of the spin-transfer torque memory unit is measured.

10. A spin-transfer torque memory apparatus according to claim 9, wherein an electrically conductive and non-magnetic spacer layer separates the compensation element from the free magnetic layer.

11. A spin-transfer torque memory apparatus according to claim 9, further comprising an magnetic field generating element that applies a magnetic field to the compensation element and sets the bias field.

12. A spin-transfer torque memory apparatus according to claim 9, wherein the compensation element comprises a ferromagnetic material having a hard magnetic property.

13. A spin-transfer torque memory apparatus according to claim 9, wherein the electrically conductive and non-magnetic spacer layer has a thickness in a range from 1 to 10 nanometers.

14. A spin-transfer torque memory apparatus according to claim 9, wherein the compensation element and the free magnetic layer have a similar shape.

15. An article, comprising:
a free magnetic layer having a magnetic easy axis and a magnetization orientation that can change direction due to spin-torque transfer when a current passes through the spin-transfer torque memory unit;
a reference magnetic element having a magnetization orientation that is pinned in a reference direction;
an electrically insulating and non-magnetic tunneling barrier layer separating the free magnetic layer from the magnetic reference element; and
a compensation element adjacent to the free magnetic layer, the compensation element applying a bias field on the magnetization orientation of the free magnetic layer, the bias field comprising a first vector component parallel to the easy axis of the free magnetic layer and a second vector component orthogonal to the easy axis of the free magnetic layer, wherein the bias field reduces a current magnitude required to switch the direction of the magnetization orientation of the free magnetic layer.

16. An article according to claim 15, further comprising an electrically conductive and non-magnetic spacer layer separating the compensation element from the free magnetic layer.

17. An article according to claim 15, further comprising a second electrically insulating and non-magnetic spacer layer separating the compensation element from the free magnetic layer.

18. An article according to claim 15, wherein the reference magnetic element comprises a synthetic antiferromagnetic reference element.

19. An article according to claim 15, wherein the compensation element comprises a ferromagnetic material having a hard magnetic property.

20. An article according to claim 15, wherein the compensation element applies a bias field on the magnetization orientation of the free magnetic layer and the bias field is configured to be set after a magnetic property of the spin-transfer torque memory unit is measured.

* * * * *